(12) United States Patent
Tsai et al.

(10) Patent No.: US 9,773,730 B2
(45) Date of Patent: Sep. 26, 2017

(54) SEMICONDUCTOR ARRANGEMENT AND FORMATION THEREOF

(71) Applicant: TAIWAN SEMICONDUCTOR MANUFACTURING COMPANY LIMITED, Hsin Chu (TW)

(72) Inventors: Chung-Hao Tsai, Huatan Township (TW); Jeng-Shien Hsieh, Kaohsiung (TW); Chuei-Tang Wang, Taichung (TW); Chen-Hua Yu, Hsinchu (TW)

(73) Assignee: TAIWAN SEMICONDUCTOR MANUFACTURING COMPANY LIMITED, Hsin-chu (TW)

( * ) Notice: Subject to any disclaimer, the term of this patent is extended or adjusted under 35 U.S.C. 154(b) by 31 days.

(21) Appl. No.: 14/991,072

(22) Filed: Jan. 8, 2016

(65) Prior Publication Data

US 2016/0126188 A1 May 5, 2016

Related U.S. Application Data

(62) Division of application No. 14/178,422, filed on Feb. 12, 2014, now Pat. No. 9,331,018.

(51) Int. Cl.
*H01L 23/00* (2006.01)
*H01L 23/522* (2006.01)
*H01L 23/66* (2006.01)

(52) U.S. Cl.
CPC ...... *H01L 23/5228* (2013.01); *H01L 23/5222* (2013.01); *H01L 23/66* (2013.01); *H01L 2223/6672* (2013.01); *H01L 2924/0002* (2013.01)

(58) Field of Classification Search
CPC ..... H01L 24/34; H01L 2224/34; H01L 39/00; H01L 27/0288; H01L 27/0629; H01L 27/0738
See application file for complete search history.

(56) References Cited

U.S. PATENT DOCUMENTS

2011/0049676 A1* 3/2011 Ding ............... H01L 23/481
257/536

* cited by examiner

*Primary Examiner* — Hoai V Pham
(74) *Attorney, Agent, or Firm* — Cooper Legal Group, LLC (57) ABSTRACT

One or more techniques for forming a semiconductor arrangement and resulting structures formed thereby are provided herein. The semiconductor arrangement includes a power divider comprising a transmission line and a resistor, where the transmission line is over and connected to an active area input, a first active area output and a second active area output. The semiconductor arrangement has a smaller chip size than a semiconductor arrangement where the transmission line is not over the active area input, the first active area output and the second active area output. The smaller chip size is due to the active area input, the first active area output and the second active area output being formed closer to one another than would be possible in a semiconductor arrangement where the transmission line is formed between at least one of the active area input, the first active area output or the second active area output.

20 Claims, 5 Drawing Sheets

SEMICONDUCTOR ARRANGEMENT AND FORMATION THEREOF

RELATED APPLICATION

This application is a divisional of and claims priority to U.S. patent application Ser. No. 14/178,422, titled "SEMICONDUCTOR ARRANGEMENT AND FORMATION THEREOF" and filed on Feb. 12, 2014, which is incorporated herein by reference.

BACKGROUND

A semiconductor arrangement comprises one or more semiconductor devices on a wafer or chip. In some examples, a wafer or chip comprises an integrated circuit. An integrated circuit is made up of interconnected semiconductor devices, such as transistors or resistors. In a transistor current flows through a channel region between a source region and a drain region upon application of a sufficient voltage or bias to a gate of the device. When current flows through the channel region, the device is generally regarded as being in an 'on' state, and when current is not flowing through the channel region, the device is generally regarded as being in an 'off' state. In a resistor current flows through the device, such that the resistor regulates said current.

DESCRIPTION OF THE DRAWINGS

Aspects of the disclosure are understood from the following detailed description when read with the accompanying drawings. It will be appreciated that elements and/or structures of the drawings are not necessarily drawn to scale. Accordingly, the dimensions of the various features may be arbitrarily increased and/or reduced for clarity of discussion.

DETAILED DESCRIPTION

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter may be practiced without these specific details. In other instances, structures and devices are illustrated in block diagram form in order to facilitate describing the claimed subject matter.

One or more techniques for forming a semiconductor arrangement and resulting structures formed thereby are provided herein.

Figure 1:
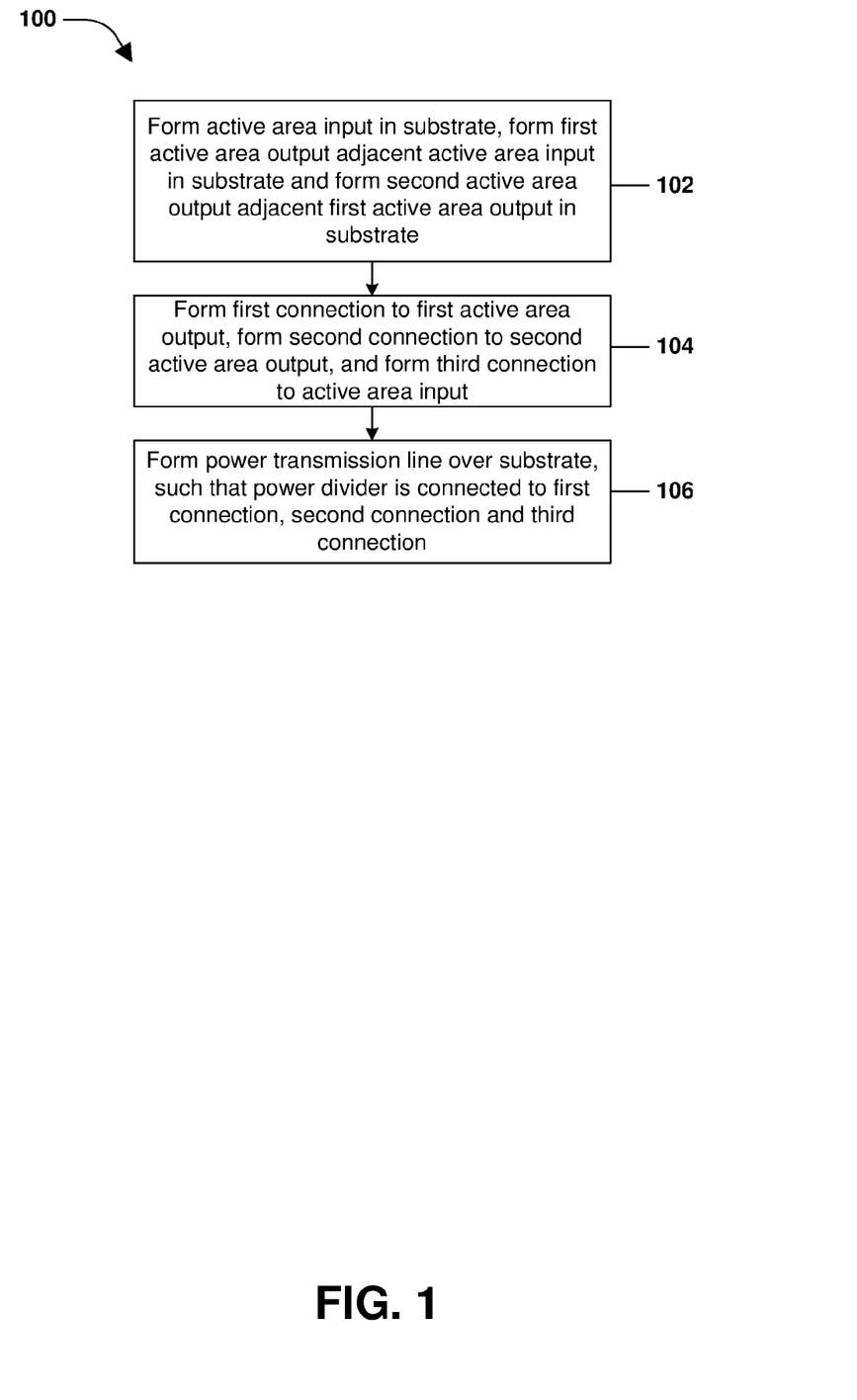
FIG. 1 is a flow diagram illustrating a method of forming a semiconductor arrangement, according to some embodiments.
Figure 2:
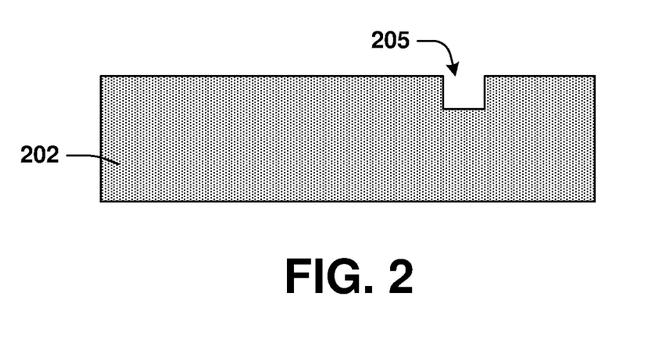
FIG. 2 is an illustration of a semiconductor arrangement, according to some embodiments.
Figure 9:
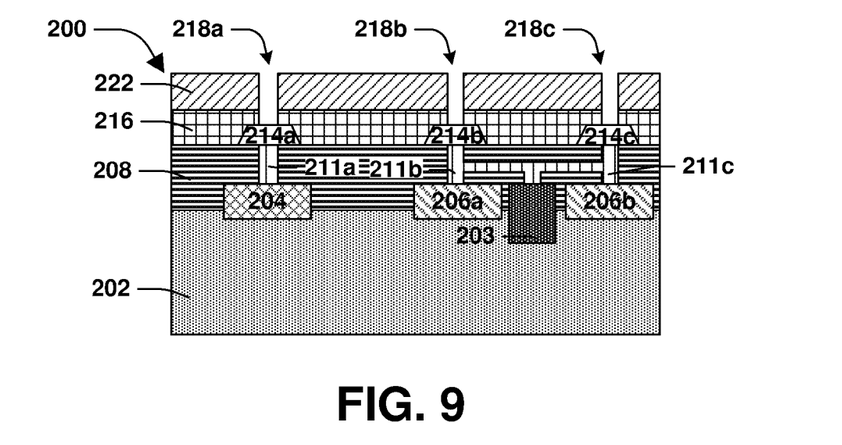
FIG. 9 is an illustration of a semiconductor arrangement, according to some embodiments.
Figure 10:
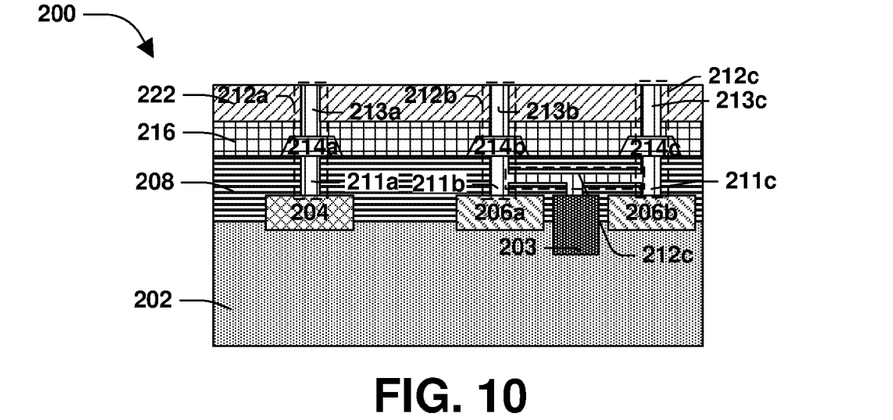
FIG. 10 is an illustration of a semiconductor arrangement, according to some embodiments.
Figure 11:
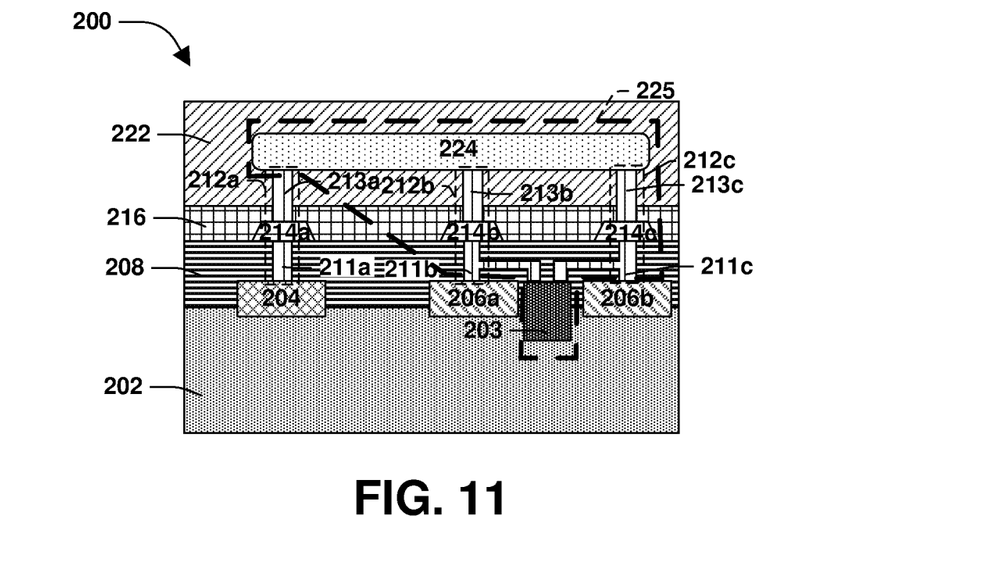
FIG. 11 is an illustration of a semiconductor arrangement, according to some embodiments.
Figure 12:
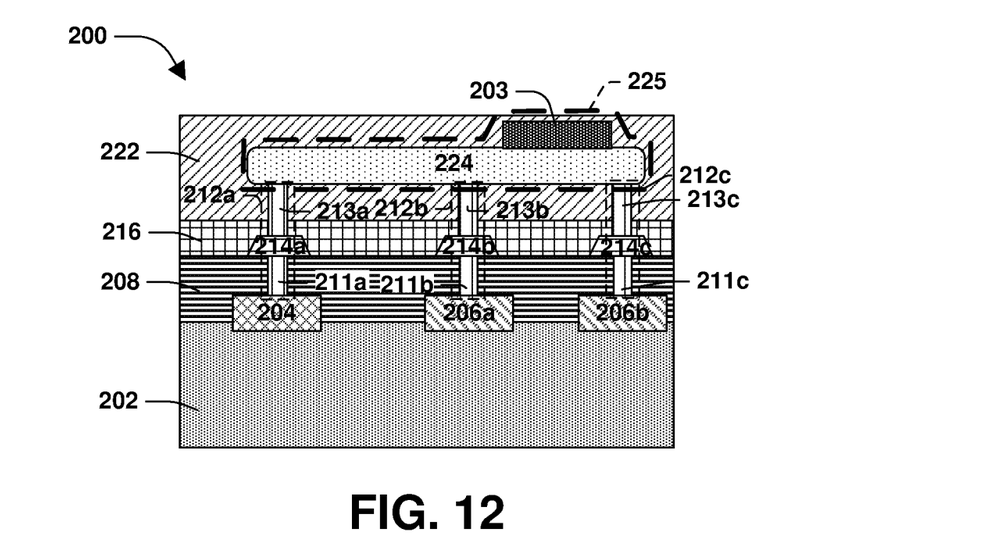
FIG. 12 is an illustration of a semiconductor arrangement, according to some embodiments.

A method 100 of forming a semiconductor arrangement 200 according to some embodiments is illustrated in FIG. 1 and one or more structures formed thereby at various stages of fabrication are illustrated in FIGS. 2-12. According to some embodiments, such as illustrated in FIG. 11 and FIG. 12, a power divider 225 of the semiconductor arrangement 200 comprises a transmission line 224 and a resistor 203. In some embodiments, such as illustrated in FIG. 11, the transmission line 224 is over the resistor 203. In some embodiments, such as illustrated in FIG. 12, the resistor 203 is over the transmission line 224. While the resistor 203 is illustrated as being in contact with or integral with the transmission line 224 in FIG. 12, the resistor 203 is coupled or mounted to the transmission line 224 with soldering joints in some embodiments. In some embodiments, the resistor 203 is otherwise coupled to the transmission line 224, such as illustrated in FIG. 11 and described in further detail below. According to some embodiments, the semiconductor arrangement 200 comprises an active area input 204, a first active area output 206a and a second active area output 206b. In some embodiments, the active area input 204 is adjacent the first active area output 206a and the first active area output 206a is adjacent the second active area output 206b in a substrate 202. In some embodiments, the first active area output 206a is connected to the transmission line 224 by a first connection 212b. In some embodiments, the first connection 212b comprises a first conductive pad 214b. In some embodiments, the second active area output 206b is connected to the transmission line 224 by a second connection 212c. In some embodiments, the second connection 212c comprises a second conductive pad 214c. In some embodiments, such as illustrated in FIG. 11, the first connection 212b connects the first active area output 206a to the resistor 203. In some embodiments, such as illustrated in FIG. 11, the second connection 212c connects the second active area output 206b to the resistor 203. In some embodiments, the active area input 204 is connected to the transmission line 224 by a third connection 212a. In some embodiments, the third connection 212a comprises a third conductive pad 214a. In some embodiments, a high dielectric constant material 208, such as silicon oxide or undoped silicon glass, is over the active area input 204, the first active area output 206a, the second active area output 206b and the substrate 202. In some embodiments, a passivation layer 216 is over the dielectric layer 208. In some embodiments, the first conductive pad 214b, the second conductive pad 214c and the third conductive pad 214a are in the passivation layer 216. In some embodiments, the transmission line 224 is formed in a dielectric layer 222. In some embodiments, at least some of the arrangement 200 is formed as part of wafer level packaging. In some embodiments, the dielectric layer 222 is a wafer level package layer. Turning to FIG. 2, a first opening 205 is formed in the substrate 202, according to some embodiments. In some embodiments, the substrate 202 comprises at least one of silicon or germanium. According to some embodiments, the substrate 202 comprises at least one of an epitaxial layer, a silicon-on-insulator (SOI) structure, a wafer, or a die formed from a wafer. In some embodiments, the substrate 202 comprises at least one of a first conductivity type or a second conductivity type. In some embodiments, the first conductivity type is at least one of a p-type or an n-type. In some embodiments, the second conductivity type is p-type if the first conductivity type is n-type and the second conductivity type is n-type if the first conductivity type is p-type. In some embodiments, the first opening 205 is formed by etching.

Figure 3:
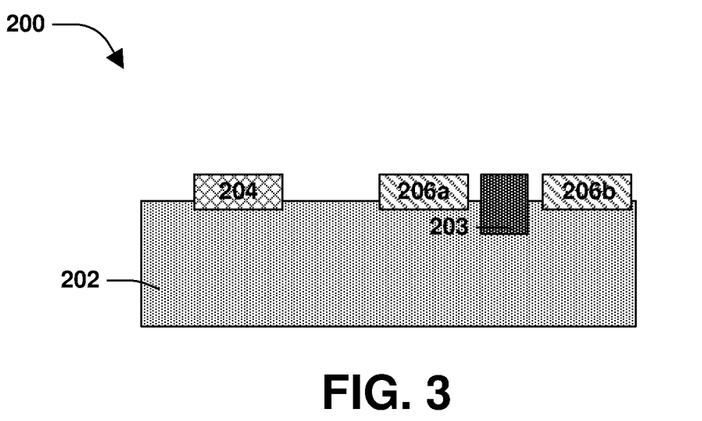
FIG. 3 is an illustration of a semiconductor arrangement, according to some embodiments.

At 102, the first active area output 206a, the second active area output 206b and the active area input 204 are formed in the substrate 202, such that the first active area output 206a is adjacent the second active area output 206b and the active area input 204, as illustrated in FIG. 3, according to some embodiments. In some embodiments, the first active area output 206a comprises a first phase shifter. In some embodiments, the second active area output 206b comprises a second phase shifter. Although, two active area outputs are illustrated, multiple active area outputs are contemplated. In some embodiments, the first active area output 206a comprises a first region of the substrate 202 doped with a first dopant. In some embodiments, the second active area output 206b comprises a second region of the substrate 202 doped with a second dopant. In some embodiments, the active area input 204 comprises a third region of the substrate 202 doped with a third dopant. In some embodiments, at least one of the first dopant, the second dopant or the third dopant are the same dopant. In some embodiments, at least one of the first dopant, the second dopant or the third dopant are the different dopants. In some embodiments, such as where the transmission line 224 is over the resistor 203, as illustrated in FIG. 11, the resistor 203 is formed in the first opening 205. In some embodiments, the resistor 203 is formed between the first active area output 206a and the second active area output 206b. In some embodiments, the resistor 203 comprises polysilicon over a dioxide, the dioxide filling in the first opening 205.

Figure 4:
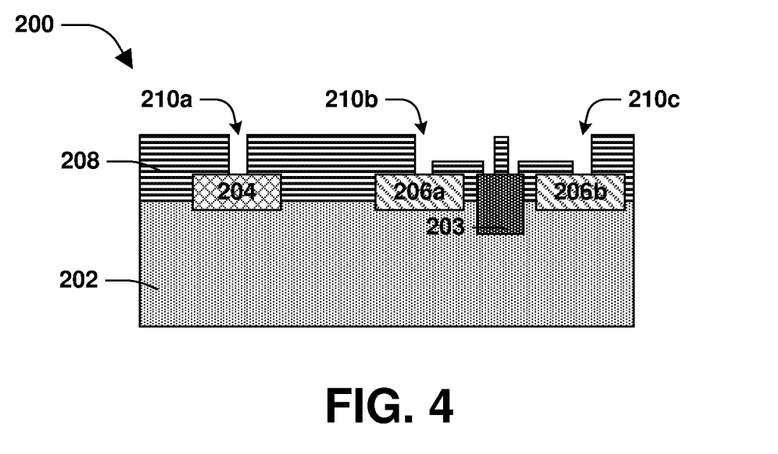
FIG. 4 is an illustration of a semiconductor arrangement, according to some embodiments.
Figure 5:
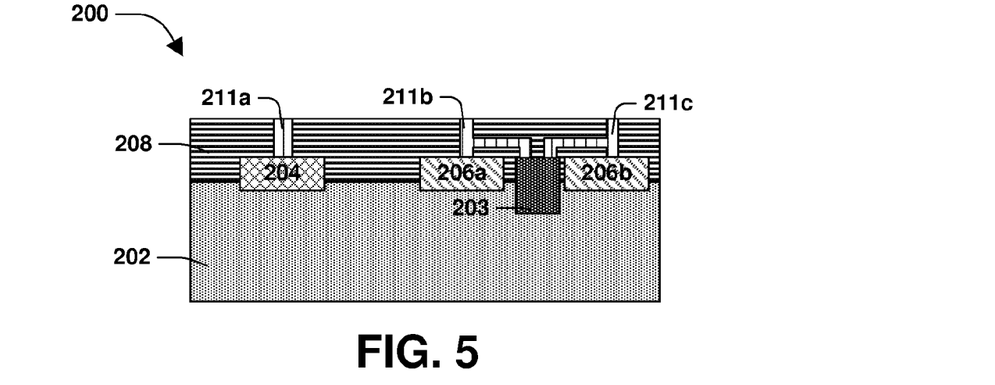
FIG. 5 is an illustration of a semiconductor arrangement, according to some embodiments.
Figure 6:
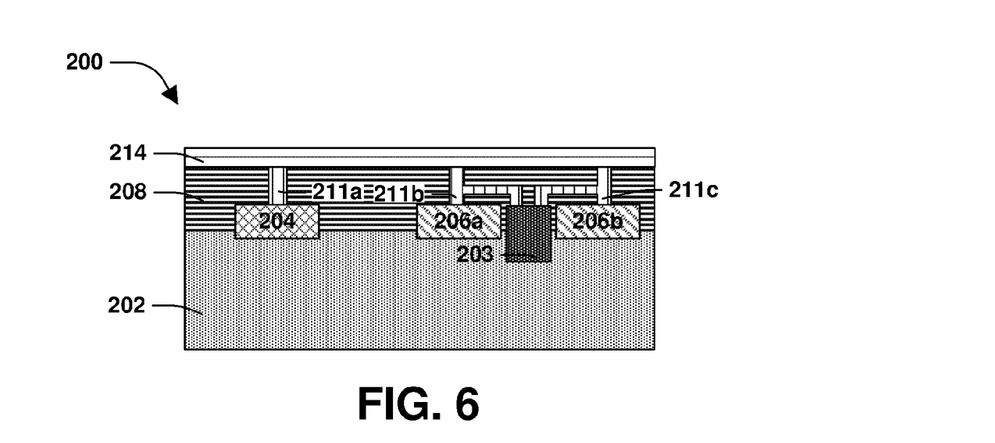
FIG. 6 is an illustration of a semiconductor arrangement, according to some embodiments.
Figure 7:
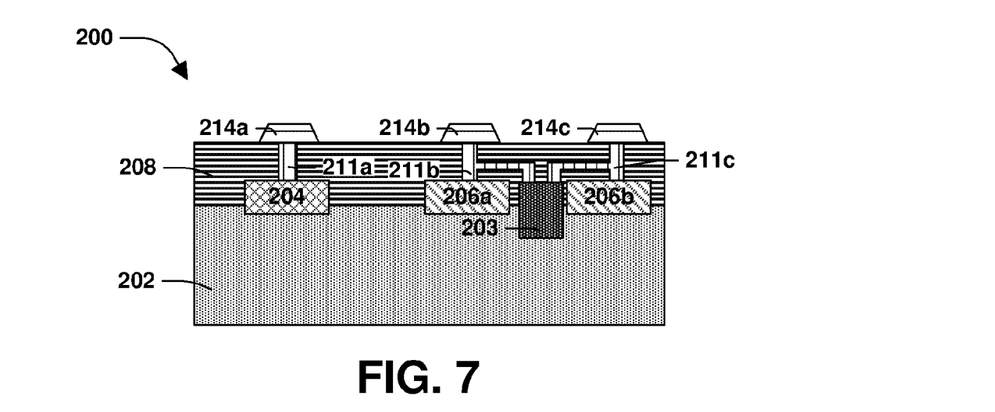
FIG. 7 is an illustration of a semiconductor arrangement, according to some embodiments.
Figure 8:
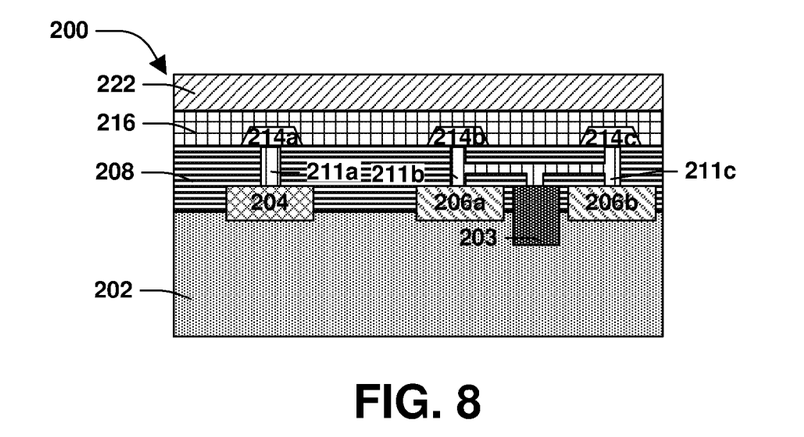
FIG. 8 is an illustration of a semiconductor arrangement, according to some embodiments.

At 104, the first connection 212b is formed, such that the first connection 212b is connected to the first active area output 206a, the second connection 212c is formed, such that the second connection 212c is connected to the second active area output 206b, and the third connection 212a is formed, such that the third connection 212a is connected to the active area input 204, as illustrated in FIG. 10, according to some embodiments. In some embodiments, such as where the transmission line 224 is over the resister 203, as illustrated in FIG. 11, the power divider 225 comprises the first connection 212b and the second connection 212c. Turning to FIG. 4, prior to FIG. 10, the high dielectric constant material 208 is formed over the first active area output 206a, the second active area output 206b and the active area input 204, according to some embodiments. In some embodiments, a first connection opening 210b, a second connection opening 210c, and a third connection opening 210a are formed, such as by etching, in the high dielectric material 208. In some embodiments, the first connection opening 210b exposes a top surface of the first active area output 206a, the second connection opening 210c exposes a top surface of the second active area output 206b, and the third connection opening 210a exposes a top surface of the active area input 204. In some embodiments, such as where the transmission line 224 is over the resistor 203, as illustrated in FIG. 11, the first connection opening 210b, and the second connection opening 210c are formed such that the first connection opening 210b exposes a first top surface of the resistor 203 and a top surface of the first active area output 206a, and the second connection opening 210c exposes a second top surface of the resistor 203 and a top surface of the second active area output 206b. In some embodiments, the first top surface of the resistor 203 and the second top surface of the resistor 203 are separate surfaces. In some embodiments, a conductive material, such as metal, is deposited in the first connection opening 210b to form a first lower portion 211b of the first connection 212b, such that the first lower portion 211b of the first connection 212b is in contact with the first active area output 206a, as illustrated in FIG. 5. In some embodiments, the conductive material is deposited in the second connection opening 210c to form a second lower portion 211c of the second connection 212c, such that the second lower portion 211c of the second connection 212c is in contact with the second active area output 206b. In some embodiments, the conductive material is deposited in the third connection opening 210a to form a third lower portion 211a of the third connection 212a, such that the third lower portion 211a of the third connection 212a is in contact with the active area input 204. In some embodiments, such as when the resistor 203 is formed in the substrate 202, the first lower portion 211b of the first connection 212b and the second lower portion 211c of the second connection 212c are formed such that the first lower portion 211b of the first connection 212b is contact with the first top surface of the resistor 203 and the top surface of the first active area output 206a, and the second lower portion 211c of the second connection 212c is in contact with the second top surface of the resistor 203 and the top surface of the second active area output 206b. In some embodiments, additional high dielectric constant material 208 is formed over a portion of the first lower portion 211b of the first connection 212b connected to the resistor 203 and over a portion of the second lower portion 211c of the second connection 212c connected to the resistor 203. Turning to FIG. 6, an optional layer of conductive material 214, such as aluminum, is formed over the high dielectric material 208, according to some embodiments. Turning to FIG. 7, the layer of conductive material 214 is patterned to form a first conductive pad 214b over and connected to the first lower portion 211b of the first connection 212b, to form a second conductive pad 214c over and connected to the second lower portion 211c of the second connection 212c and to form a third conductive pad 214a over and connected to the third lower portion 211a of the third connection 212a, according to some embodiments. Turning to FIG. 8, a passivation layer 216 is formed over the high dielectric constant material 208, and optional the first conductive pad 214b, the second conductive pad 214c, and the third conductive pad 214a, according to some embodiments. In some embodiments, the passivation layer 216 comprises silicon nitride. In some embodiments, a dielectric layer 222 is formed over the passivation layer 216. In some embodiments, the dielectric layer 222 comprises at least one of silicon, oxide or nitride. Turning to FIG. 9, a fourth connection opening 218b is formed in the passivation layer 216 and the dielectric layer 222, such that a top surface of the first conductive pad 214b is exposed, or when no conductive pad is formed, a top surface of the first lower portion 211b of the first connection 212b is exposed. In some embodiments, a fifth connection opening 218c is formed in the passivation layer 216 and the dielectric layer 222, such that a top surface of the second conductive pad 214c is exposed, or when no conductive pad is formed, a top surface of the second lower portion 211c of the second connection 212c is exposed. In some embodiments, a sixth connection opening 218a is formed in the passivation layer 216 and the dielectric layer 222, such that a top surface of the third conductive pad 214a is exposed, or when no conductive pad is formed, a top surface of the third lower portion 211a of the third connection 212a is exposed. In some embodiments, the fourth connection opening 218b, the fifth connection opening 218c and the sixth connection opening 218a are formed by etching. In some embodiments, a conductive material, such as metal, is deposited in the fourth connection opening 218b to form a first upper portion 213b of the first connection 212b, such that first upper portion 213b of the first connection 212b is in contact with the first conductive pad 214b, or where no conductive pad is formed, with the first lower portion 211b of the first connection 212b, as illustrated in FIG. 10. In some embodiments, the conductive material is deposited in the fifth connection opening 218c to form a second upper portion 213c of the second connection 212c, such that the second upper portion 213c of the second connection 212c is in contact with the second conductive pad 214c, or where no conductive pad is formed, with the second lower portion 211c of the second connection 212c. In some embodiments, the conductive material is deposited in the sixth connection opening 218a to form a third upper portion 213a of the third connection 212a, such that the third upper portion 213a of the third connection 212a is in contact with the third conductive pad 214a, or where no conductive pad is formed, with the third lower portion 211a of the third connection 212a. In some embodiments, at least one of 211a, 211b, 211c, 213a, 213b or 213c comprise the same or different materials.

At 106, a transmission line 224 is formed over the substrate 202, such that the transmission line 224 is connected to the first connection 212b, the second connection 212c and the third connection 212a, as illustrated in FIG. 11 and FIG. 12, according to some embodiments. In some embodiments, such as illustrated in FIG. 12, the power divider 225 comprises the transmission line 224 and the resistor 203. In some embodiments, such as illustrated in FIG. 11, the power divider 225 comprises the transmission line 224, the first connection 212b, the second connection 212c and the resistor 203. In some embodiments, to form the transmission line 224 a layer is deposited over the dielectric layer 222 and is patterned to form the transmission line 224, such that the transmission line 224 is above and connected to the first connection 212b, the second connection 212c and the third connection 212a. In some embodiments, the transmission line 224 comprises copper. In some embodiments, additional dielectric layer 222 is formed, such as by deposition, over the transmission line 224. Turning to FIG. 12, where the resistor 203, is not formed in the substrate 202, the resistor 203 is formed over the transmission line 224 by forming a resistor opening in the dielectric layer 222 over the transmission line 224, such that a portion of the transmission line 224 is exposed. In some embodiments, a dielectric material is formed in the resistor opening and polysilicon is formed over the dielectric material in the resistor opening to form the resistor 203. In some embodiment, where the resistor 203 is not integral with the transmission line 224, the resistor 203 is mounted, such as by soldering, on the surface of the transmission line 224 and thus connected to the transmission line 224. In some embodiments, the resistor 203 formed over the transmission line 224 between the first active area output 206a and the second active area output 206b, and is connected to at least one of the first active area output 206a via the transmission line 224 and the first connection 212b or the second active area output 206b via the transmission line 224 and the second connection 212c. In some embodiments, the resistor 203 formed over the transmission line 224 is not connected to the active area input 204. In some embodiments, the semiconductor arrangement 200 comprises a smaller chip size than a semiconductor arrangement where at least one of the power divider 225 or the transmission line 224 is not over the active area input 204, the first active area output 206a and the second active area output 206b. In some embodiments, the smaller chip size is due to the active area input 204, the first active area output 206a and the second active area output 206b being formed closer to one another than would be possible in an embodiment where at least one of the power divider 225 or the transmission line 224 is formed between at least one of the active area input 204, the first active area output 206a or the second active area output 206b, rather than over the active area input 204, the first active area output 206a and the second active area output 206b. In some embodiments, the smaller chip size is due to the active area input 204, the first active area output 206a and the second active area output 206b being formed closer to one another than would be possible in an embodiment where the resistor 203 is formed between at least one of the active area input 204, the first active area output 206a or the second active area output 206b, rather than over the transmission line 224. According to some embodiments, all or substantially all of the active area input 204, the first active area output 206a and the second active area output 206b are vertically disposed under or are covered by the transmission line 224, which allows a lateral spacing or distance between the active area input 204 and the second active area output 206b to be reduced, thus yielding the smaller chip size. In some embodiments, a lateral spacing or distance from the active area input 204 to the second active area output 206b is less than or substantially equal to a lateral dimension, as measured from left to right on the page, of the transmission line 224, thus providing for the smaller or reduced chip size. In some embodiments, a lateral spacing or distance from the active area input 204 to the second active area output 206b is less than 1.8 times a lateral dimension, as measured from left to right on the page, of the transmission line 224, thus providing for the smaller or reduced chip size.

According to some embodiments, a semiconductor arrangement comprises a first active area output in a substrate adjacent an active area input, a second active area output in the substrate adjacent the first active area output and a power divider comprising a transmission line and a resistor, where the transmission line is over the active area input, the first active area output and the second active area output. In some embodiments, the transmission line is connected to the active area input, the first active area output and the second active area output.

According to some embodiments, a method of forming a semiconductor arrangement comprises forming an active area input in a substrate, forming a first active area output in the substrate adjacent the active area input and forming a second active area output in the substrate adjacent the first active area output. In some embodiments, the method of forming a semiconductor arrangement further comprises forming a first connection to the first active area output, forming a second connection to the second active area output, and forming a third connection to the active area input. In some embodiments, the method of forming a semiconductor arrangement further comprises forming a power divider comprising a transmission line and a resistor, such that the transmission line is over the first active area output, the second active area output and the active area input and is connected to the first connection, the second connection and the third connection.

According to some embodiments, a semiconductor arrangement comprises a first active area output in a substrate adjacent an active area input, a second active area output in the substrate adjacent the first active area output and a power divider comprising a resistor and a transmission line, where the transmission line is over the active area input, the first active area output and the second active area output. In some embodiments, the transmission line is connected to the active area input, the first active area output and the second active area output. In some embodiments, the resistor is at least one of above the transmission line or below the transmission line between the first active area output and the second active area output.

Although the subject matter has been described in language specific to structural features or methodological acts, it is to be understood that the subject matter of the appended claims is not necessarily limited to the specific features or acts described above. Rather, the specific features and acts described above are disclosed as embodiment forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method of forming a semiconductor arrangement, comprising:
   forming an active area input in a semiconductor substrate;
   forming a first active area output in the semiconductor substrate adjacent the active area input;
   forming a second active area output in the semiconductor substrate adjacent the first active area output;
   forming a first connection to the first active area output;
   forming a second connection to the second active area output;
   forming a third connection to the active area input; and
   forming a power divider comprising a transmission line and a resistor, such that the transmission line is over the first active area output, the second active area output, and the active area input and coupled to the first connection, the second connection and the third connection.

2. The method of claim 1, at least one of:
   the first connection comprising a first lower portion and a first upper portion, the forming a first connection comprising forming a first conductive pad between the first lower portion and the first upper portion;
   the second connection comprising a second lower portion and a second upper portion, the forming a second connection comprising forming a second conductive pad between the second lower portion and the second upper portion; and
   the third connection comprising a third lower portion and a third upper portion, the forming a third connection comprising forming a third conductive pad between the third lower portion and the third upper portion.

3. The method of claim 1, at least one of:
   the forming a first active area output comprising doping a first region of the semiconductor substrate with a first dopant;
   the forming a second active area output comprising doping a second region of the semiconductor substrate with a second dopant; or
   the forming an active area input comprising doping a third region of the semiconductor substrate with a third dopant.

4. The method of claim 1, at least one of:
   the forming a first active area output comprising forming a first phase shifter; or
   the forming a second active area output comprising forming a second phase shifter.

5. The method of claim 1, comprising:
   forming the resistor in the semiconductor substrate such that at least one of the first active area output or the second active area output is coupled to the resistor.

6. The method of claim 1, comprising:
   forming the resistor over the transmission line.

7. The method of claim 1, comprising:
forming at least one of a passivation layer or a high dielectric constant material between the transmission line and the active area input, the first active area output, and the second active area output.

8. A method of forming a semiconductor arrangement, comprising:
etching a semiconductor substrate to define an opening;
depositing a dielectric in the opening and a polysilicon over the dielectric to define a resistor;
doping a first region and a second region of the semiconductor substrate on a first side of the resistor to define an active area input and a first active area output;
doping a third region of the semiconductor substrate on a second side of the resistor to define a second active area output;
forming a dielectric material over the active area input, the first active area output, the second active area output, and the resistor;
forming a first connection through the dielectric material to the active area input, a second connection through the dielectric material to the first active area output, and a third connection through the dielectric material to the second active area output; and
forming a power divider comprising a transmission line over the active area input, the first active area output, and the second active area output, wherein the transmission line is coupled to the first connection, the second connection, and the third connection.

9. The method of claim 8, the doping a first region and a second region of the semiconductor substrate comprising doping the first region and the second region with a same dopant.

10. The method of claim 9, the doping a third region of the semiconductor substrate comprising doping the third region with the same dopant.

11. The method of claim 8, the forming a first connection through the dielectric material comprising:
etching the dielectric material to form a second opening exposing a top surface of the active area input; and
depositing a first conductive material within the second opening.

12. The method of claim 11, comprising:
depositing a second conductive material over the dielectric material; and
patterning the second conductive material to define a conductive pad, the first conductive material within the second opening and the conductive pad defining the first connection.

13. The method of claim 12, comprising:
forming a passivation layer over the dielectric material and over the conductive pad; and
forming a dielectric layer over the passivation layer.

14. The method of claim 13, wherein the first connection, the second connection, and the third connection extend through the passivation layer and the dielectric layer.

15. The method of claim 13, comprising:
etching the passivation layer and the dielectric layer to form a third opening exposing a top surface of the conductive pad; and
depositing a third conductive material within the third opening, the first conductive material within the second opening, the conductive pad, and the third conductive material within the third opening defining the first connection.

16. The method of claim 15, wherein the first conductive material, the second conductive material, and the third conductive material have a same composition.

17. The method of claim 13, comprising:
depositing a fourth conductive material over the dielectric layer;
etching the fourth conductive material to form the transmission line; and
depositing additional dielectric material around the transmission line.

18. The method of claim 8, the forming a second connection through the dielectric material comprising:
etching the dielectric material to form a second opening exposing a top surface of the first active area output and a third opening exposing a top surface of the resistor; and
depositing a conductive material within the second opening and the third opening, the conductive material having a continuous current path between the first active area output and the resistor.

19. The method of claim 18, comprising:
depositing additional dielectric material in the third opening.

20. A method of forming a semiconductor arrangement, comprising:
etching a semiconductor substrate to define an opening;
depositing a dielectric in the opening and a polysilicon over the dielectric to define a resistor;
doping a first region and a second region of the semiconductor substrate on a first side of the resistor to define an active area input and a first active area output;
doping a third region of the semiconductor substrate on a second side of the resistor to define a second active area output;
forming a dielectric material over the active area input, the first active area output, the second active area output, and the resistor;
forming a first connection through the dielectric material to the active area input, a second connection through the dielectric material to the first active area output and the resistor, and a third connection through the dielectric material to the second active area output and the resistor; and
forming a power divider comprising a transmission line over the active area input, the first active area output, and the second active area output, wherein the transmission line is coupled to the first connection, the second connection, and the third connection.

* * * * *